(12) United States Patent
Manstretta

(10) Patent No.: US 7,504,813 B2
(45) Date of Patent: Mar. 17, 2009

(54) HIGH PRECISION POWER DETECTOR

(75) Inventor: Danilo Manstretta, Stradella (IT)

(73) Assignee: Broadcom Corporation, Irvine, CA (US)

(*) Notice: Subject to any disclaimer, the term of this patent is extended or adjusted under 35 U.S.C. 154(b) by 432 days.

(21) Appl. No.: 11/250,375

(22) Filed: Oct. 17, 2005

(65) Prior Publication Data
US 2006/0125453 A1 Jun. 15, 2006

Related U.S. Application Data

(60) Provisional application No. 60/635,175, filed on Dec. 13, 2004.

(51) Int. Cl.
G05F 3/04 (2006.01)
G05F 3/16 (2006.01)

(52) U.S. Cl. ...................... 323/312; 323/907

(58) Field of Classification Search ............ 323/268, 323/271, 312, 315–317, 907; 324/105, 120, 324/123 R, 123 C; 330/2, 252, 253, 256, 330/259–261, 289, 290
See application file for complete search history.

(56) References Cited

U.S. PATENT DOCUMENTS 5,079,454 A * 1/1992 Benton et al. .................. 327/65
5,796,309 A * 8/1998 Nguyen ....................... 330/289
5,873,029 A * 2/1999 Grondahl et al. ............ 455/126
6,531,860 B1 * 3/2003 Zhou et al. .................. 324/105

* cited by examiner

Primary Examiner—Matthew V Nguyen
(74) Attorney, Agent, or Firm—Sterne, Kessler, Goldstein & Fox P.L.L.C.

(57) ABSTRACT

A power detector having temperature compensation for improved measurement performance includes a pair of rectifier transistors coupled to a differential input signal biased by a first temperature dependent current. An output of the pair of rectifier transistors provides a first component of a differential DC output signal. The first component of the differential DC output signal includes a DC voltage proportional to an amplitude of the differential input signal plus an offset voltage. The power detector further includes a reference transistor biased by a reference current. The reference current includes a second temperature dependent current and a temperature independent offset current for temperature compensation. An output of the reference transistor provides a second component of the differential DC output signal that includes a reference voltage. The temperature independent offset current is adjusted such that the reference voltage substantially equals the offset voltage, thereby improving the precision of the power detector.

19 Claims, 6 Drawing Sheets ental Patent Application No. 60/635,175, filed Dec. 13, 2004,

HIGH PRECISION POWER DETECTOR

CROSS REFERENCE TO RELATED APPLICATIONS

This application claims the benefit of U.S. Provisional Patent Application No. 60/635,175, filed Dec. 13, 2004, which is incorporated herein by reference in its entirety.

BACKGROUND OF THE INVENTION

1. Field of the Invention

The present invention generally relates to power detectors. More specifically, the present invention provides a power detector having temperature compensation for improved measurement performance.

2. Background Art

Power detectors measure the amplitude or power of an input signal. The precision of a power detector is limited by linearity errors and process and temperature variations. The constituent components of a power detector typically exhibit a strong dependence on temperature, especially at low input power levels. Therefore, as temperature varies, the output measurement provided by a power detector can fluctuate considerably for a given constant input amplitude. This limits the range of input amplitudes that can be accurately measured to relatively high levels where the effects of temperature variation are less pronounced. Further, input signal bandwidth decreases if low power input signals require increased amplification prior to detection.

BRIEF DESCRIPTION OF THE DRAWINGS/FIGURES

The accompanying drawings illustrate the present invention and, together with the description, further serve to explain the principles of the invention and to enable one skilled in the pertinent art to make and use the invention.

Figure 6:
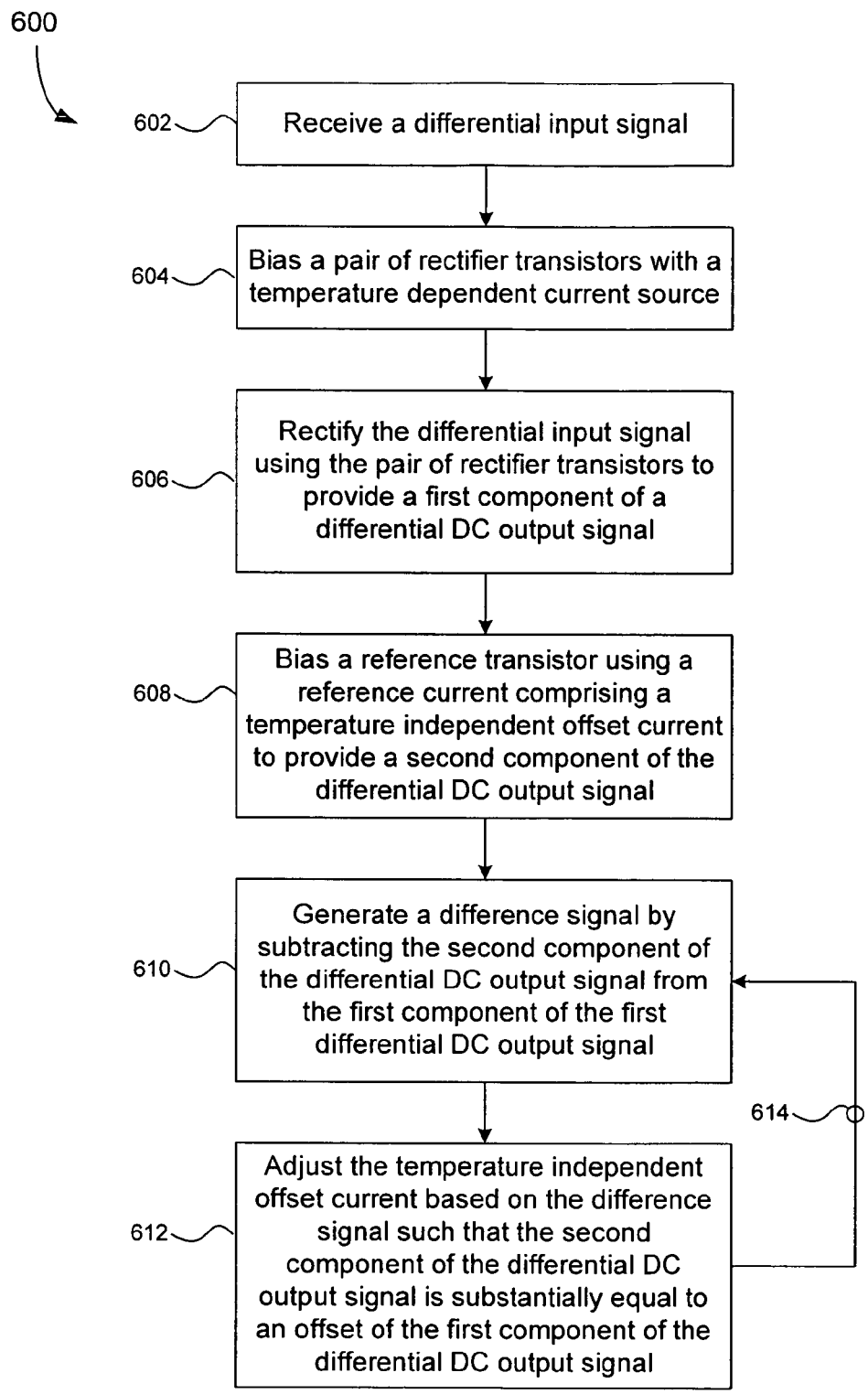

FIG. 6 provides a flowchart that illustrates operational steps for adjusting the temperature compensation of a rectifier of the present invention to improve measurement performance according to the present invention.

Features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that the following detailed description is exemplary and explanatory and is intended to provide further explanation of the invention as claimed.

DETAILED DESCRIPTION OF THE INVENTION

Figure 1:
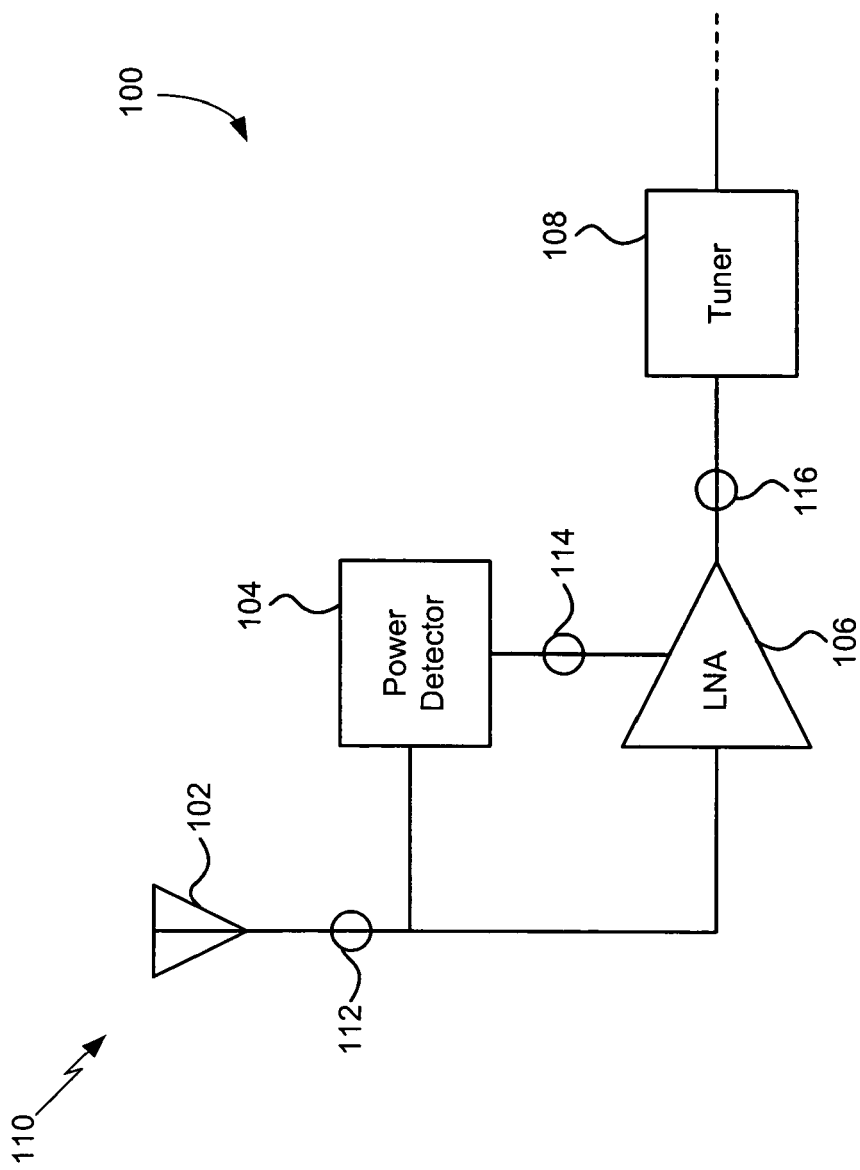
FIG. 1 illustrates a conventional wireless receiver.

FIG. 1 illustrates the front-end of a conventional wireless receiver 100. The conventional wireless receiver 100 includes an antenna 102, a conventional power detector 104, a low noise amplifier (LNA) 106 and a tuner 108. The antenna 102 receives a transmitted wireless signal 110 and provides a received signal 112 to the conventional power detector 104 and the LNA 106. The LNA 106 amplifies the received signal 112 and provides an amplified received signal 116 to the tuner 108. The transmitted wireless signal 110 and the received signal 112 are typically radio frequency (RF) signals.

The tuner 108 operates optimally when the amplitude of the amplified received signal 116 is constant. The variable gain of the LNA 106 is adjusted to compensate for fluctuations in the amplitude of the received signal 112 to provide an amplified received signal 116 having constant amplitude. The variable gain of the LNA 106 is properly adjusted through the use of the conventional power detector 104. The conventional power detector 104 measures the amplitude or power of the received signal 112 and produces a voltage signal 114 as an indication of the measurement. The voltage signal 114 is provided to the LNA 106. The variable gain of the LNA 106 can be precisely set based on the voltage signal 114 to provide the amplified received signal 116 having constant amplitude.

The precision of the conventional power detector 104 largely determines the precision of the gain adjustment by the LNA 106. Therefore, it is desirable to eliminate variations in the voltage signal 114 caused by frequency, process and temperature.

Figure 2:
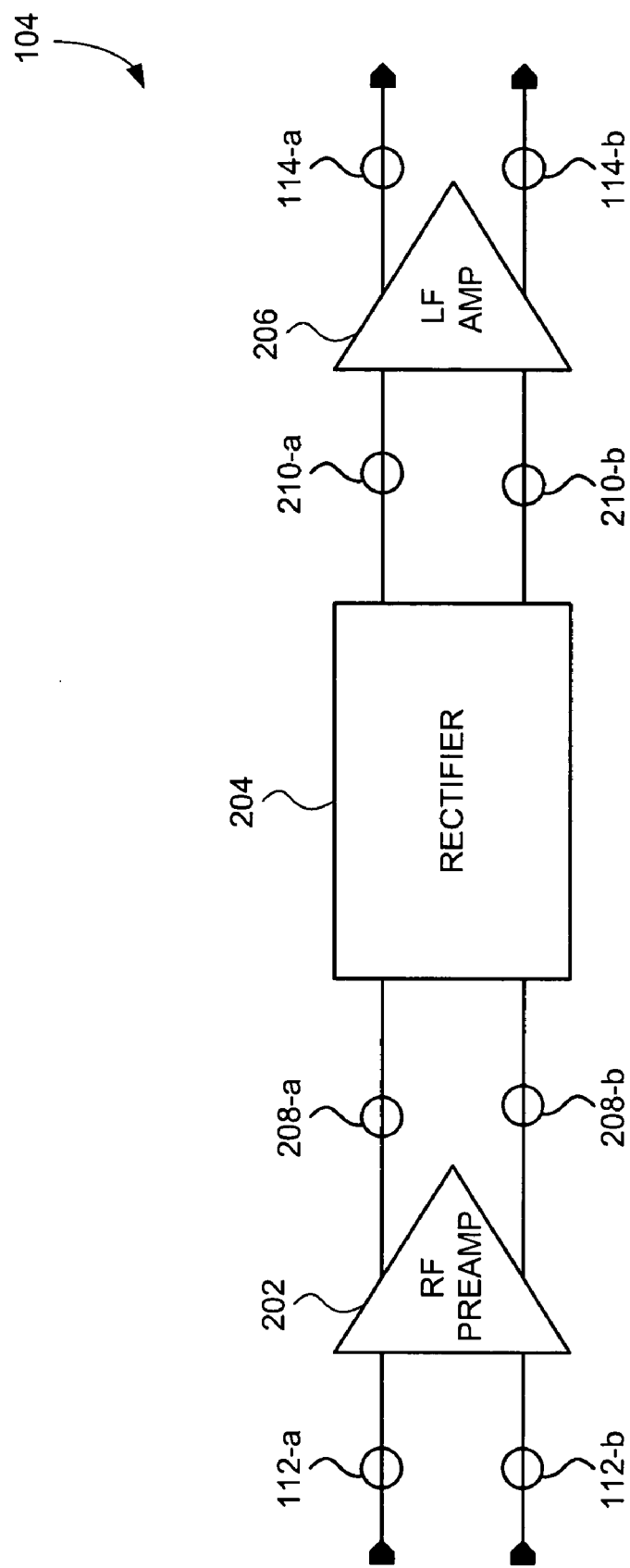
FIG. 2 illustrates a conventional power detector.

FIG. 2 illustrates an implementation of the conventional power detector 104. As shown, the conventional power detector 104 includes an RF preamplifier 202, a conventional rectifier 204 and a low frequency (LF) amplifier 206. The RF preamplifier amplifies the incoming received signal 112 (shown in FIG. 2 as differential received signals 112-$a$ and 112-$b$). The RF preamplifier provides amplified received signals 208-$a$ and 208-$b$ to the conventional rectifier 204. The conventional rectifier 204 converts the amplified received signals 208-$a$ and 208-$b$ from differential RF signals to differential DC output signals 210-$a$ and 210-$b$. The differential DC output signals 210-$a$ and 210-$b$ are provided to the LF amplifier 206. The LF amplifier amplifies the differential DC output signals 210-$a$ and 210-$b$ to produce the voltage signal 114 (shown in FIG. 2 as differential voltage signals 114-$a$ and 114-$b$).

The precision of the conventional power detector 104 is largely influenced by the linearity of the conventional rectifier 204. Therefore, it is desirable for the conventional rectifier 204 to provide a linear change in output voltage for a linear variation in the amplitude of an input signal.

Figure 3:
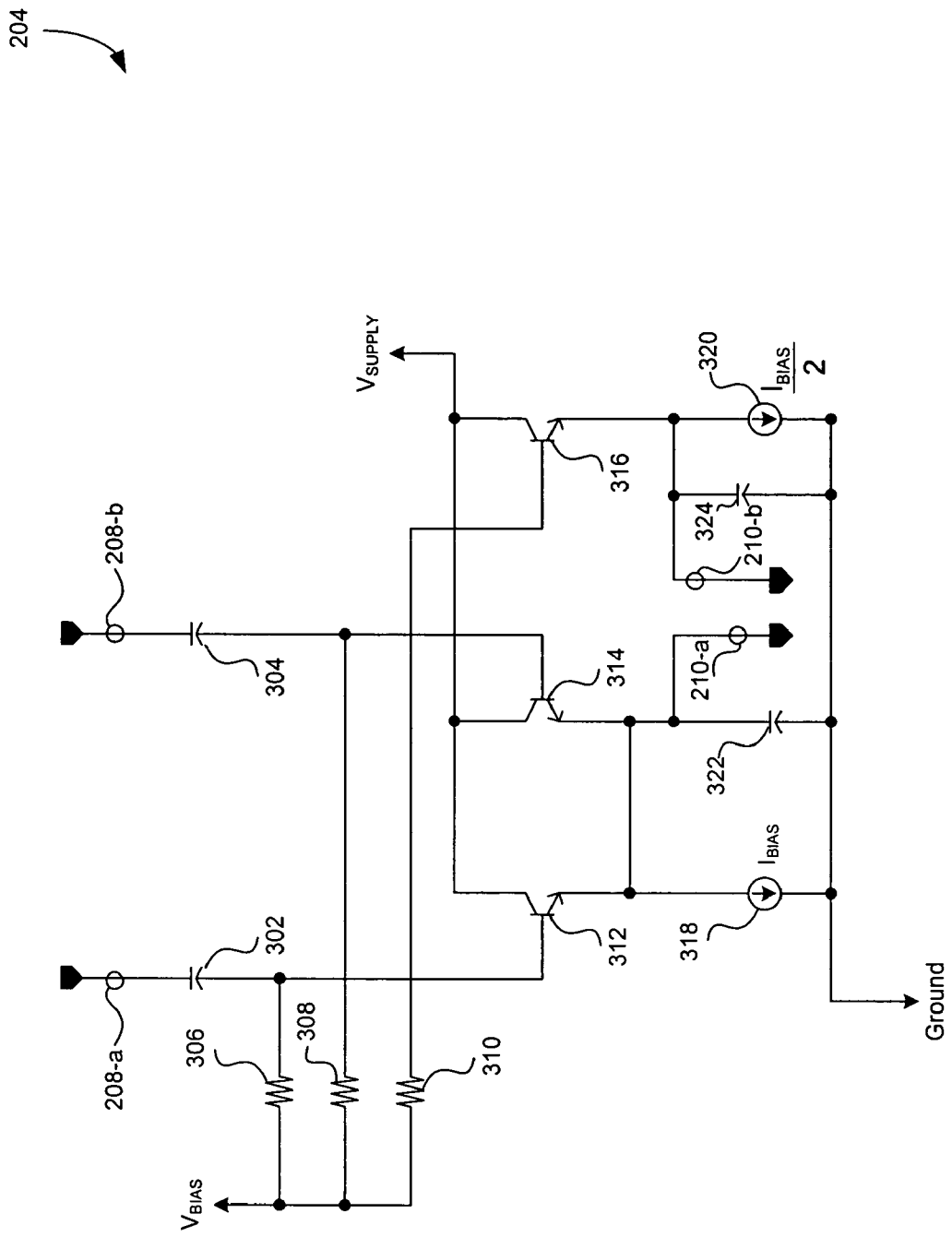
FIG. 3 illustrates a conventional rectifier.

FIG. 3 illustrates an implementation of the conventional rectifier 204. The conventional rectifier 204 includes rectifier transistors 312 and 314 and a reference transistor 316. The rectifier transistors 312 and 314 and the reference transistor 316 are Bipolar Junction Transistors (BJTs). The rectifier transistors 312 and 314 and the reference transistor 316 are of the same small unit size. The collectors of the rectifier transistors 312 and 314 and the collector of the reference transistor 316 are connected to a supply voltage $V_{SUPPLY}$. The base of the rectifier transistor 312 is AC coupled to the amplified received signal 208-$a$ through a capacitor 302. The base of the rectifier transistor 312 is DC coupled to a bias voltage $V_{BIAS}$ through a resistor 306. Similarly, the base of the rectifier transistor 314 is AC coupled to the amplified received signal 208-$b$ through a capacitor 304 and is DC coupled to $V_{BIAS}$ through a resistor 308. Further, the base of the reference transistor 316 is DC coupled to $V_{BIAS}$ through a resistor 310.

The bias voltage $V_{BIAS}$ and the resistors 306, 308 and 310 form a bias network for the transistors 312, 314 and 316. Typically, the resistors 306, 308 and 310 have equal resistances to provide the same biasing to the bases of the rectifier transistors 312 and 314 and to the base of the reference transistor 316. Further, the resistances of the resistors 306, 308 and 310 are typically large to isolate the bias network from the RF input signals (i.e., the amplified received signals 208-*a* and 208-*b*).

As further illustrated in FIG. 3, the emitters of the rectifier transistors 312 and 314 are connected together and provide the DC output signal 210-*a*. A current source 318 provides a bias current $I_{BIAS}$ to the emitters of the rectifier transistors 312 and 314. The emitters of the rectifier transistors 312 and 314 are coupled to a capacitor 322. Typically, the capacitor 322 has a large capacitance. The capacitor 322 forms a resistor-capacitor (RC) filter with either an inherent emitter resistance of the rectifier transistors 312 and 314 or with a resistance from a load connected to the emitters of the rectifier transistors 312 and 314.

The emitter of the reference transistor 316 provides the DC output signal 210-*b*. The emitter of the reference transistor 316 is biased by a current source 320 that provide a bias current $I_{BIAS}/2$. Further, the emitter of the reference transistor 316 is coupled to a capacitor 324 that typically has a large capacitance. The capacitor 324 forms an RC filter with either an inherent emitter resistance of the reference transistor 316 or with a resistance from a load connected to the emitter of the reference transistor 316. Capacitor 324 also improves the interference immunity of the DC output signal 210-*b*.

During operation, the conventional rectifier 204 produces a DC output voltage that is proportional to the amplitude of the differential input signal received by the conventional rectifier 204. Specifically, the difference between the DC output signal 210-*a* and 210-*b* is a DC output voltage that is proportional to the amplitudes of the amplified received signals 208-*a* and 208-*b*.

The rectifier transistors 312 and 314 rectify the differential amplified received signals 208-*a* and 208-*b* and provide a first component of the DC output voltage (i.e., the DC output signal 210-*a*). The DC output signal 210-*a* is averaged by the RC filter connected to the emitters of the rectifier transistors 312 and 314. The DC output signal 210-*a* includes a DC voltage proportional to the amplitudes of the amplified received signals 208-*a* and 208-*b* and an offset voltage. The offset voltage is the result of the biasing of the rectifier transistors 312 and 314, which is needed to establish the rectifying operation of the rectifier transistors 312 and 314.

The reference transistor 316 provides a second component of the DC output voltage (i.e., DC output signal 210-*b*). The DC output signal 210-*b* is a reference voltage approximately equal to the offset voltage of the DC output signal 210-*a*. Therefore, subtracting the DC output signal 210-*b* from the DC output signal 210-*a* cancels the offset voltage such that the conventional rectifier 204 provides a DC output voltage that is proportional to the amplitude of the differential input signal received by the conventional rectifier 204.

The precision of the conventional rectifier 204 is limited by linearity errors and process and temperature variations. A linear RF rectifier produces an output voltage that increases at a constant rate as the RF input signal amplitude is increased. A BJT arranged in a common-collector configuration exhibits strong linear behavior and so is typically used for the rectifier transistors 312 and 314 and the reference transistor 316. Further, process variations between similar circuit elements of the conventional rectifier 204 can be made small by limiting random mismatches between constituent circuit elements. However, absolute process and temperature variations can still significantly limit the precision of the conventional rectifier 204. For example, when the conventional rectifier 204 is implemented within an Automatic Gain Control (AGC) loop, undesirable gain loops or ripples can be introduced as temperature varies.

The conventional rectifier 204 exhibits an especially strong dependence on temperature at low input power levels. The strong temperature dependence of the conventional rectifier 204 is largely the result of the BJTs used to implement the conventional rectifier 204. The DC current versus voltage (I-V) characteristics of BJTs are temperature dependent. Therefore, as temperature varies, the output voltage of a BJT varies considerably for a given constant input current. In turn, the measurement performance of the conventional power detector 204 suffers. This temperature dependence also limits the range of input amplitudes that can be accurately measured by the conventional power detector 204 to relatively high levels where the effects of temperature variation are less pronounced. Further, RF input bandwidth is limited if low power input signals require higher RF gain prior to power detection.

It is therefore desirable to reduce or eliminate the temperature dependence of a power detector to improve measurement precision. Specifically, it is desirable for a power detector to have temperature compensation so as to improve RF input bandwidth, expand acceptable input amplitude range, and reduce measurement inaccuracy.

Figure 4:
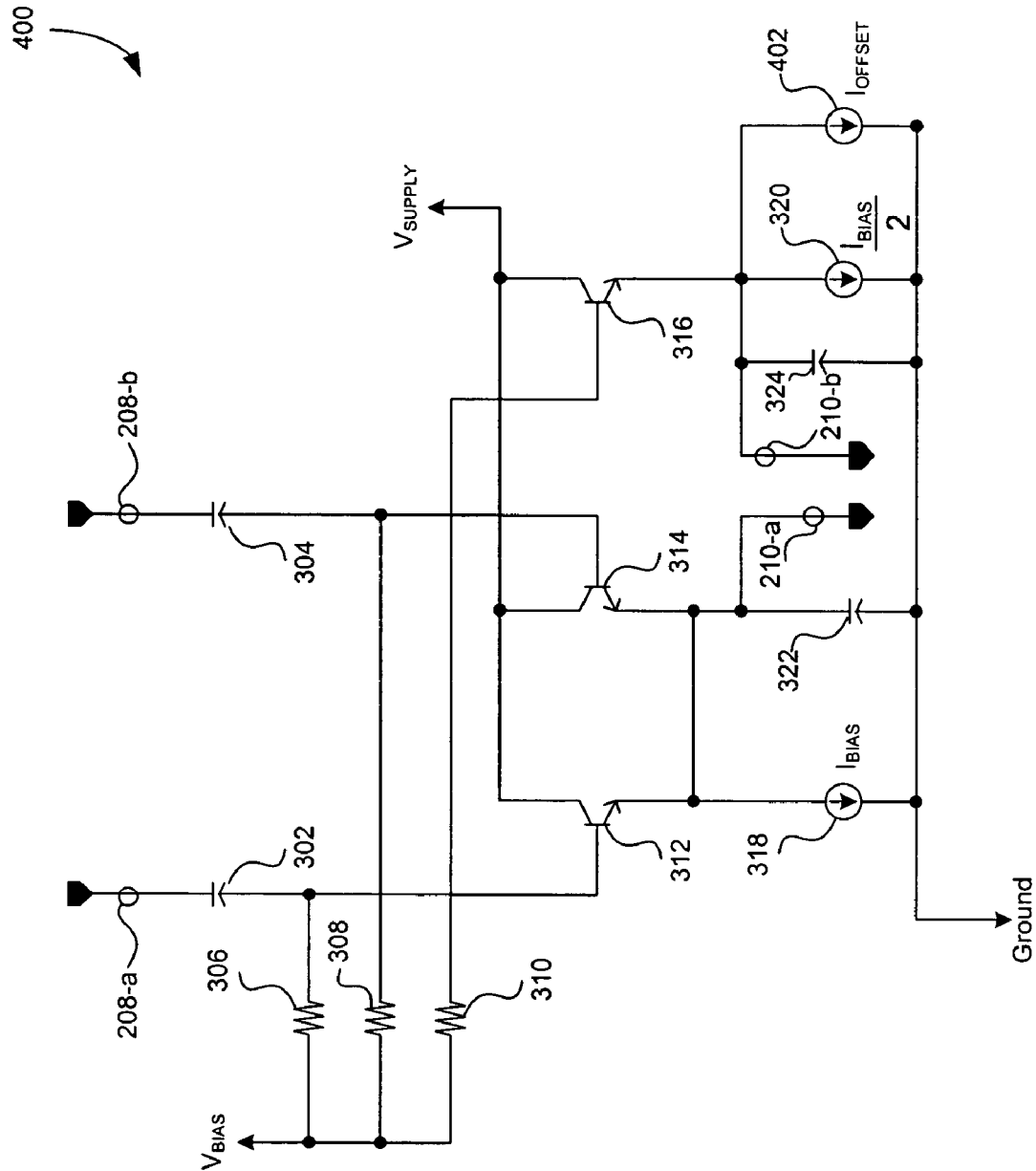
FIG. 4 illustrates an embodiment of a rectifier of the present invention having temperature compensation for improved measurement performance.

FIG. 4 illustrates a rectifier 400 of the present invention having temperature compensation for improved measurement performance. The rectifier 400 is used within a power detector to minimize or reduce output temperature dependence. The rectifier 400 includes an offset current source 402 that generates an offset current $I_{OFFSET}$. The offset current source 402 is connected to the emitter of the reference transistor 316. The offset current $I_{OFFSET}$ is constant over temperature (CAT) or temperature independent. The offset current $I_{OFFSET}$ exploits the inherent temperature dependence of the BJT I-V characteristic so as to cancel, to first order, the variation introduced by temperature.

The offset current $I_{OFFSET}$ adds to the biasing of the reference transistor 316. In turn, variations in the output of the rectifier 400 caused by temperature are canceled to first order to provide a more precise output for use in a power detector. In this way, the BJT dependence on temperature ceases to be the dominant error factor of the rectifier 400, even at low input power levels. The precision of the rectifier 400 therefore only remains limited to process variation and nonlinearity.

The rectifier transistors 312 and 314 and the reference transistor 316 each have an inherent temperature coefficient governed by the laws of physics and determined by fabrication. The temperature coefficient of each transistor is a measure of the output temperature dependence for each transistor. Each temperature coefficient can be made small and approximately equivalent by sizing the rectifier transistors 312 and 314 and the reference transistor 316 to be small and of equal size. In turn, the temperature dependence of the output of the rectifier transistors 312 and 314 and the reference transistor 316 for a given input is approximately equal.

This similar temperature dependence, however, can vary as the biasing and operation of each transistor varies. To maintain similar biasing, each terminal of the rectifier transistors 312 and 314 and the reference transistor 316 are biased with equal DC voltages and currents. During operation, however, the bases of the rectifier transistors 312 and 314 are driven harder than the base of the rectifier transistor 316 due to the amplified received signals 208-*a* and 208-*b*, respectively. That is, the AC input signals (i.e., the amplified received signals 208-*a* and 208-*b*) enhance the effects of the temperature dependence of the rectifier transistors 312 and 314. The effects of the temperature dependence of the reference transistor 316 are not similarly enhanced during operation since the reference transistor 316 is only biased by DC currents and voltages and is not driven by an AC input signal.

The increased temperature dependence of the rectifier transistors 312 and 314 causes the constant base-to-emitter voltage drops ($V_{BE,312}$ and $V_{BE,314}$) to differ from the constant base-to-emitter voltage drop ($V_{BE,316}$) of the reference transistor 316. When $V_{BE,316}$ differs from $V_{BE,312}$ and $V_{BE,314}$, the difference signal produced by subtracting the DC output signals 210-a and 210-b from one another is a less accurate measurement of the amplitude of the RF input signal (i.e., the amplified received signals 208-a and 208-b). Specifically, the reference voltage provided by the DC output signal 210-b will no longer approximately equal the offset voltage component of the DC output signal 210-a.

To improve the measurement accuracy of the rectifier 400, the offset current source 402 is used to provide temperature compensation. The offset current source 402 boosts the biasing of the reference transistor 316 such that $V_{BE,316}$ more closely follows changes to $V_{BE,312}$ and $V_{BE,314}$ during operation. In this way, the offset current source can be adjusted such that the reference voltage of the DC output signal 210-b is substantially equal to the offset voltage of the DC output signal 210-a. In turn, the difference signal generated by subtracting the DC output signal 210-b from the DC output signal 210-a is a more accurate measure of the amplitudes of the amplified received signals 208-a and 208-b. Specifically, the measurement performance of the rectifier 400 is improved with respect to the measurement performance of the rectifier 300 depicted in FIG. 3.

The offset current $I_{OFFSET}$ generated by the offset current source 402 can be made independent of temperature by placing the offset current source 402 off-chip. Specifically, the current source 402 can be referenced to an external resistor that is not susceptible to temperature fluctuations experienced by the other circuit elements of the rectifier 400. In contrast, the current sources 318 and 320 are temperature dependent since they are generated on-chip. Specifically, the current sources 318 and 320 are referenced to a local resistor that is susceptible to the temperature fluctuations experienced by the other circuit elements of the rectifier 400.

The scaling of the offset current $I_{OFFSET}$ generated by the offset current source 402 is determined by the amount of temperature dependence correction required. For example, the offset current $I_{OFFSET}$ can be chosen based on the expected range of power levels of the amplified received signals 208-a and 210-b. Alternatively, the offset current $I_{OFFSET}$ can be kept constant at a level that is optimized for a given input power. In one embodiment, the offset current $I_{OFFSET}$ can be set approximately equal to $2 \cdot I_{BIAS}$ under nominal temperature and process conditions to provide an appropriate temperature dependence correction.

The temperature compensation of the rectifier 400 provided by the present invention enables a power detector to produce more accurate amplitude or power measurements of input signals. Further, the temperature compensation technique provided by the present invention can improve RF input bandwidth and expand the acceptable input amplitude range. Overall, the temperature compensation provided by the present invention prevents dependence on temperature from being the dominant error factor during operation of a power detector.

Figure 5:
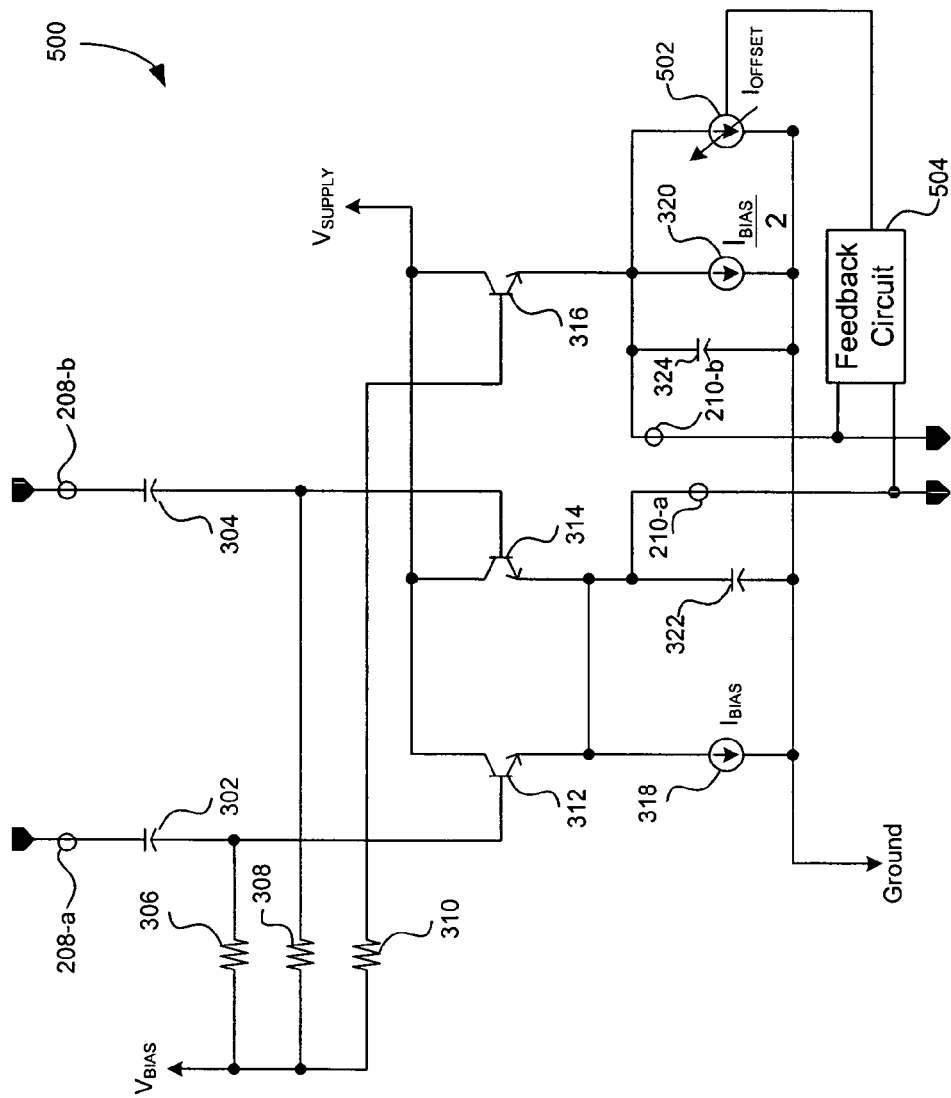
FIG. 5 illustrates an alternative embodiment of a rectifier of the present invention using feedback to provide temperature compensation for improved measurement performance.

FIG. 5 illustrates a rectifier 500 of the present invention that uses feedback to provide temperature compensation for improved measurement performance. The rectifier 500 includes an adjustable current source 502 that is a constant current over temperature (CTAT). The adjustable current source 502 provides an adjustable offset current $I_{OFFSET}$. The adjustable current source 502 is adjusted during operation of the rectifier 500 by a feedback circuit 504. The feedback circuit 504 is coupled to the output of the rectifier 500. The feedback circuit 504 measures the difference between DC output signals 210-a and 210-b and adjusts the adjustable current source 502 based on the detected output amplitude.

FIG. 6 provides a flowchart 600 that illustrates operational steps corresponding to FIG. 5 for adjusting a CTAT offset current of a rectifier to provide temperature compensation for improved measurement performance, according to the present invention. The invention is not limited to this operational description. Rather, it will be apparent to persons skilled in the relevant art(s) from the teachings herein that other operational control flows are within the scope and spirit of the present invention. In the following discussion, the steps in FIG. 6 are described.

At step 602, a differential input signal is received. The differential input signal can be a baseband or RF input signal.

At step 604, a pair of rectifier transistors are biased using a temperature dependent current source.

At step 606, the differential input signal is rectified using the pair of rectifier transistors to provide a first component of a differential DC output signal. The first component of the differential DC output signal comprises a DC voltage proportional to an amplitude of the differential input signal plus an offset voltage.

At step 608, a reference transistor is biased using a reference current generated by a temperature dependent current source and a temperature independent current source to provide a second component of a differential DC output signal. The second component of the differential DC output signal comprises a reference voltage.

At step 610, a difference signal is generated by subtracting the second component of the differential DC output signal from the first component of the differential DC output signal.

At step 612, the temperature independent current source is adjusted based on the difference signal such that the second component of the differential DC output signal is substantially equal to the offset voltage of the first component of the differential DC output signal. Specifically, a CTAT current provided by the temperature independent current source is adjusted so that the reference voltage is substantially equal to the offset voltage. In turn, the difference signal provides a more accurate measurement of the amplitude of the differential input signal since the CTAT offset current effectively counteracts the temperature dependence of the rectifier.

At step 614, the difference signal is monitored during operation of the rectifier. The CTAT offset current source is adjusted based on the difference signal in order to provide an accurate measure of the amplitude of the differential input signal.

In the foregoing description, embodiments of the present invention are described as including BJTs. The present invention, however, is not limited to embodiments using BJTs. That is, other processes and transistor structures could be used as will be understood by those skilled in the relevant arts, based on the discussion given herein. For example, Metal-Oxide Semiconductor Field-Effect Transistors (MOSFETs) can be used to realize the present invention. Using MOSFETs may require the use of a variable offset current. Further, the present invention is not limited to use within the circuits described herein. That is, the present invention can be used in a variety of circuits to provide a more accurate power measurement of an input signal. For example, the present invention can be used in AGC loops, automatic amplitude control loops, quadrature calibration circuitry or any other circuit that performs RF amplitude measurements, as commonly found in RF receivers and transmitters.

CONCLUSION

While various embodiments of the present invention have been described above, it should be understood that they have been presented by way of example and not limitation. It will be apparent to one skilled in the pertinent art that various changes in form and detail can be made therein without departing from the spirit and scope of the invention. Therefore, the present invention should only be defined in accordance with the following claims and their equivalents.

What is claimed is:

1. A power detector, comprising:
a pair of rectifier transistors coupled to a differential input signal and biased by a first temperature dependent current;
a capacitor coupled to an output of the pair of rectifier transistors to provide a first component of a differential DC output signal; and
a reference transistor biased by a reference current and having an output to provide a second component of the differential DC output signal;
wherein the reference current comprises a second temperature dependent current and a temperature independent offset current.

2. The power detector of claim 1, wherein:
the first component of the differential DC output signal comprises a DC voltage proportional to an amplitude of the differential input signal plus an offset voltage; and
the second component of the differential DC output signal comprises a reference voltage.

3. The power detector of claim 2, wherein the temperature independent offset current is adjusted such that the reference voltage is substantially equal to the offset voltage.

4. The power detector of claim 3, wherein the temperature independent offset current is adjusted based on an expected range of the amplitude of the differential input signal.

5. The power detector of claim 3, wherein the temperature independent offset current is set at a constant level based on a constant input power level of the differential input signal.

6. The power detector of claim 3, further comprising a feedback circuit to adjust the temperature independent offset current.

7. The power detector of claim 6, wherein the feedback circuit is coupled to the output of the pair of rectifier transistors and the output of the reference transistor.

8. The power detector of claim 7, wherein the feedback circuit adjusts the temperature independent offset current based on a difference between the first component of the differential DC output signal and the second component of the differential DC output signal.

9. The power detector of claim 1, wherein the second temperature dependent current is a fraction of the first temperature dependent current.

10. The power detector of claim 9, wherein the second temperature dependent current is approximately one-half of the first temperature dependent current.

11. The power detector of claim 1, wherein the temperature independent offset current is generated by an external current source.

12. The power detector of claim 1, wherein each transistor comprises a Bipolar Junction Transistor (BJT).

13. The power detector of claim 1, wherein each transistor comprises a Metal Oxide Semiconductor Field-Effect Transistor (MOSFET).

14. The power detector of claim 1, wherein the differential input signal is a differential radio frequency (RF) signal.

15. A method for measuring the amplitude of a differential input signal, comprising:
(1) biasing a pair of rectifier transistors with a first temperature dependent current source;
(2) rectifying a differential input signal using the pair of rectifier transistors to provide a first component of a differential DC output signal; and
(3) biasing a reference transistor using a reference current to provide a second component of the differential DC output signal;
wherein the reference current comprises a second temperature dependent current and a temperature independent offset current.

16. The method of claim 15, further comprising the step of:
(4) generating a difference signal proportional to an amplitude of the differential input signal by subtracting the second component of the differential DC output signal from the first component of the differential DC output signal.

17. The method of claim 16, wherein step (3) further comprises
(a) adjusting the temperature independent offset current based on the difference signal such that the second component of the differential DC output signal is substantially equal to an offset of the first component of the differential DC output signal.

18. A power detector, comprising:
a pair of rectifier transistors coupled to a differential input signal and biased by a first temperature dependent current, wherein an output of the pair of rectifier transistors provides a first component of a differential DC output signal; and
a reference transistor biased by a reference current, wherein an output of the reference transistor provides a second component of the differential DC output signal;
wherein the reference current comprises a second temperature dependent current and a temperature independent offset current.

19. The power detector of claim 18, wherein:
the first component of the differential DC output signal comprises a DC voltage proportional to an amplitude of the differential input signal plus an offset voltage; and
the second component of the differential DC output signal comprises a reference voltage substantially equal to the offset voltage.

* * * * *